US008966162B2

(12) United States Patent
Lo et al.

(10) Patent No.: US 8,966,162 B2
(45) Date of Patent: Feb. 24, 2015

(54) FLASH MEMORY CONTROLLER AND METHOD FOR GENERATING A DRIVING CURRENT FOR FLASH MEMORIES

(71) Applicant: Silicon Motion, Inc., Jhubei (TW)

(72) Inventors: Chun-Yi Lo, New Taipei (TW); Jen-Hsin Weng, Hsinchu (TW)

(73) Assignee: Silicon Motion, Inc., Jhubei (TW)

( * ) Notice: Subject to any disclaimer, the term of this patent is extended or adjusted under 35 U.S.C. 154(b) by 211 days.

(21) Appl. No.: 13/680,879

(22) Filed: Nov. 19, 2012

(65) Prior Publication Data

US 2013/0132649 A1    May 23, 2013

(30) Foreign Application Priority Data

Nov. 18, 2011    (TW) .............................. 100142225 A

(51) Int. Cl.
    *G11C 16/00*      (2006.01)
    *G06F 12/02*      (2006.01)
    *G11C 16/06*      (2006.01)
    *G06F 13/16*      (2006.01)

(52) U.S. Cl.
    CPC ............ *G06F 12/0246* (2013.01); *G11C 16/06* (2013.01); *G06F 13/1668* (2013.01)
    USPC ....................................... 711/103

(58) Field of Classification Search
    CPC .. G06F 12/0246; G06F 13/1668; G11C 16/06
    USPC ........................................ 711/103
    See application file for complete search history.

(56) References Cited

U.S. PATENT DOCUMENTS

| 7,146,159 | B1 | 12/2006 | Zhu |
| 2002/0181311 | A1* | 12/2002 | Miyauchi ..................... 365/227 |
| 2005/0128814 | A1* | 6/2005 | Yang et al. ............... 365/185.26 |
| 2007/0055821 | A1* | 3/2007 | Ootsuka et al. .............. 711/115 |
| 2010/0049905 | A1* | 2/2010 | Ouchi ........................... 711/103 |
| 2010/0077134 | A1* | 3/2010 | Chen ............................ 711/103 |
| 2011/0271036 | A1* | 11/2011 | Cheng et al. ................. 711/103 |

(Continued)

FOREIGN PATENT DOCUMENTS

| CN | 1433027 A | 7/2003 |
| CN | 101124552 A | 2/2008 |

(Continued)

OTHER PUBLICATIONS

Office Action of corresponding CN application, published on Oct. 17, 2014.

*Primary Examiner* — Than Nguyen
(74) *Attorney, Agent, or Firm* — Wang Law Firm, Inc.; Li K. Wang; Stephen Hsu

(57) ABSTRACT

The invention provides a flash memory controller. In one embodiment, the flash memory controller is coupled to a plurality of flash memories, and comprises a driving current generator and a processor. The driving current generator generates a driving current to drive the flash memories. The processor calculates the total number of flash memories, determines a driving current value according to the total number of flash memories, and directs the driving current generator to generate the driving current with a level greater than or equal to the driving current value. The driving current value is determined by the processor to be increased with an increase of the total number of flash memories.

14 Claims, 6 Drawing Sheets

(56) References Cited

U.S. PATENT DOCUMENTS

2011/0271046 A1* 11/2011 Iyer et al. ...................... 711/103
2013/0124888 A1* 5/2013 Tanaka et al. ................. 713/320

FOREIGN PATENT DOCUMENTS

| CN | 101952894 A | 1/2011 |
| CN | 102081967 A | 6/2011 |

* cited by examiner

| Total number of flash memories | 1 | 2 | 4 | 8 | 16 | 32 | 64 | 128 |
|---|---|---|---|---|---|---|---|---|
| Driving current value (mA) | 4 | 6 | 8 | 16 | 24 | 32 | 64 | 128 |

FIG. 5

FLASH MEMORY CONTROLLER AND METHOD FOR GENERATING A DRIVING CURRENT FOR FLASH MEMORIES

CROSS REFERENCE TO RELATED APPLICATIONS

This Application claims the benefit of priority to Taiwan Patent Application No. 100142225, filed on Nov. 18, 2011, the entirety of which is incorporated by reference herein.

BACKGROUND OF THE INVENTION

1. Field of the Invention

The invention relates to flash memories, and more particularly to flash memory controllers.

2. Description of the Related Art

A flash memory needs a driving current to drive the operation thereof. Ordinarily, a driving current for a flash memory is provided by a flash memory controller. The flash memory controller provides a driving current with a constant level to drive flash memories. Because a single flash memory stores a limited amount of data, an electronic apparatus with an increased data capacity comprises more then one flash memory controlled by a single flash memory controller.

To increase data capacity of an electronic apparatus, the total number of flash memories controlled by a flash memory controller is increased. Referring to FIG. 1, a schematic diagram of a flash memory controller 102 controlling a plurality of flash memories is shown. The driving current provided by the flash memory controller 102 must maintain the data-access operations of eight flash memories 111~118. Because the flash memory controller 102 merely provides a driving current with a constant level, and the driving current is shared between the flash memories 111~118, each flash memory only obtains a portion of the driving current. When the total number of the flash memories controlled by the flash memory controller 102 is less than four, the driving current provided by the flash memory controller 102 can ensure correctness of the data-access operations of the flash memories. When the total number of the flash memories controlled by the flash memory controller 102 is greater than four, the level of the driving current obtained by each flash memory cannot maintain correctness of data-access operations, and errors are introduced into the data-access operations.

Referring to FIG. 2A, a schematic diagram of a data signal output by a flash memory driven by a driving current with an appropriate level is shown. When the flash memory is driven by a driving current with an appropriate level, the rising time of a data signal output by the flash memory is 1.2 ns, and the amplitude of the data signal is 3.3V. When the flash memory is driven by a driving current with an insufficient level, the driving current cannot provide enough power to the flash memory, and the data signal output by the flash memory has a high attenuation and a high noise level. Referring to FIG. 2B, a schematic diagram of a data signal output by a flash memory driven by a driving current with an insufficient level is shown. When the flash memory is driven by a driving current with an insufficient level, the rising time of a data signal output by the flash memory is lengthened to 4.45 ns, and the amplitude of the data signal is reduced to 2.8V. Errors are therefore easily introduced into the data-access operations of the flash memories. To maintain correctness of the data-access operations of the flash memory, a driving current with an appropriate level is therefore required. A flash memory controller capable of generating a driving current with an appropriate level is therefore required.

BRIEF SUMMARY OF THE INVENTION

The invention provides a flash memory controller. In one embodiment, the flash memory controller is coupled to a plurality of flash memories, and comprises a driving current generator and a processor. The driving current generator generates a driving current to drive the flash memories. The processor calculates the total number of flash memories, determines a driving current value according to the total number of flash memories, and directs the driving current generator to generate the driving current with a level greater than or equal to the driving current value. The driving current value is determined by the processor to be increased with an increase of the total number of flash memories.

The invention also provides a method for generating a driving current for flash memories. First, the total number of a plurality of flash memories coupled to a flash memory controller is calculated. A driving current value is then determined according to the total number of flash memories, wherein the driving current value is determined to be increased with an increase of the total number of flash memories. A driving current generator is then directed to generate a driving current with a level greater than or equal to the driving current value needed to drive the flash memories.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 5 is a schematic diagram of an embodiment of a driving current table according to the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
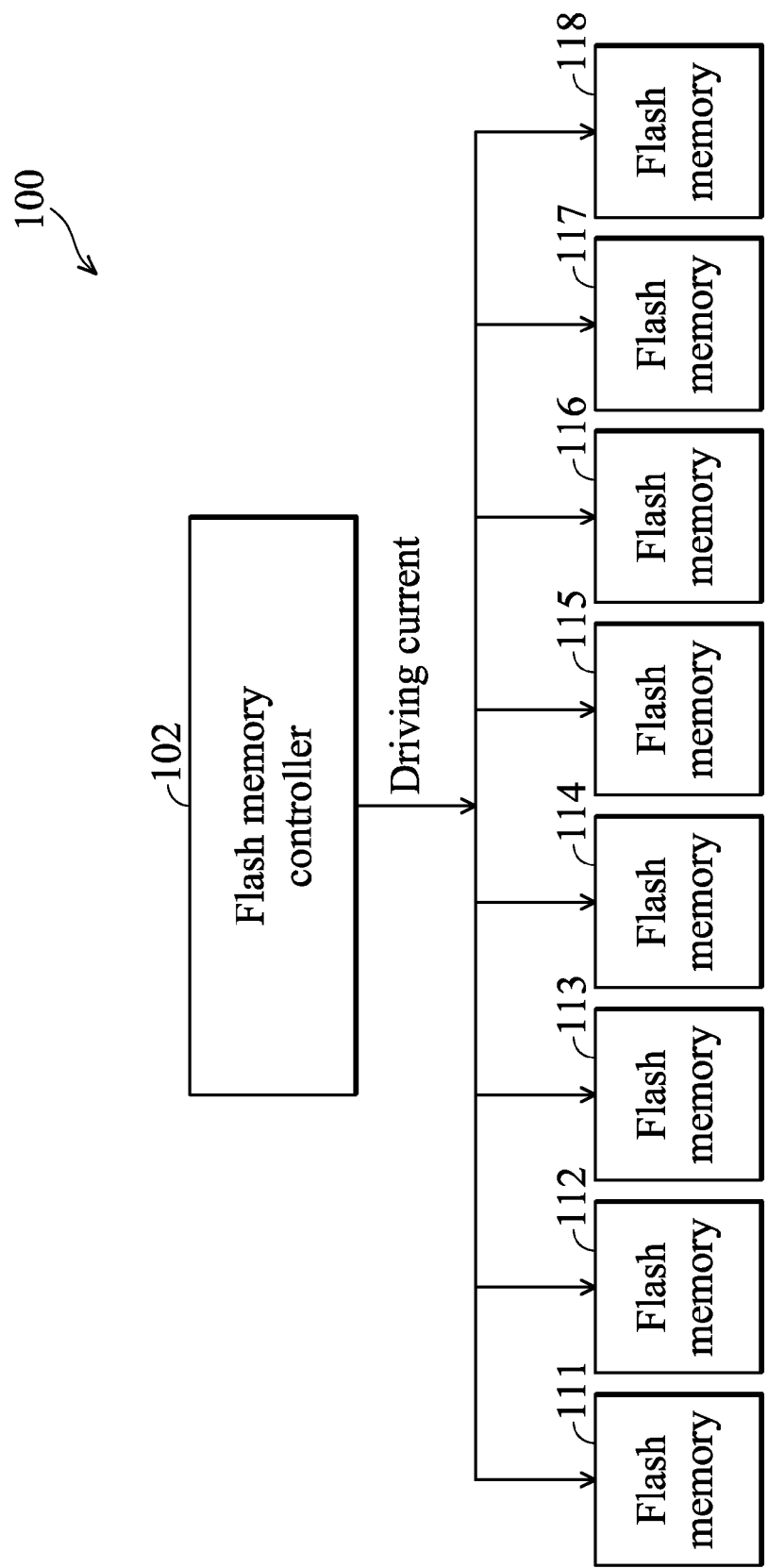
FIG. 1 is a conventional schematic diagram of a flash memory controller controlling a plurality of flash memories.
Figure 2A:
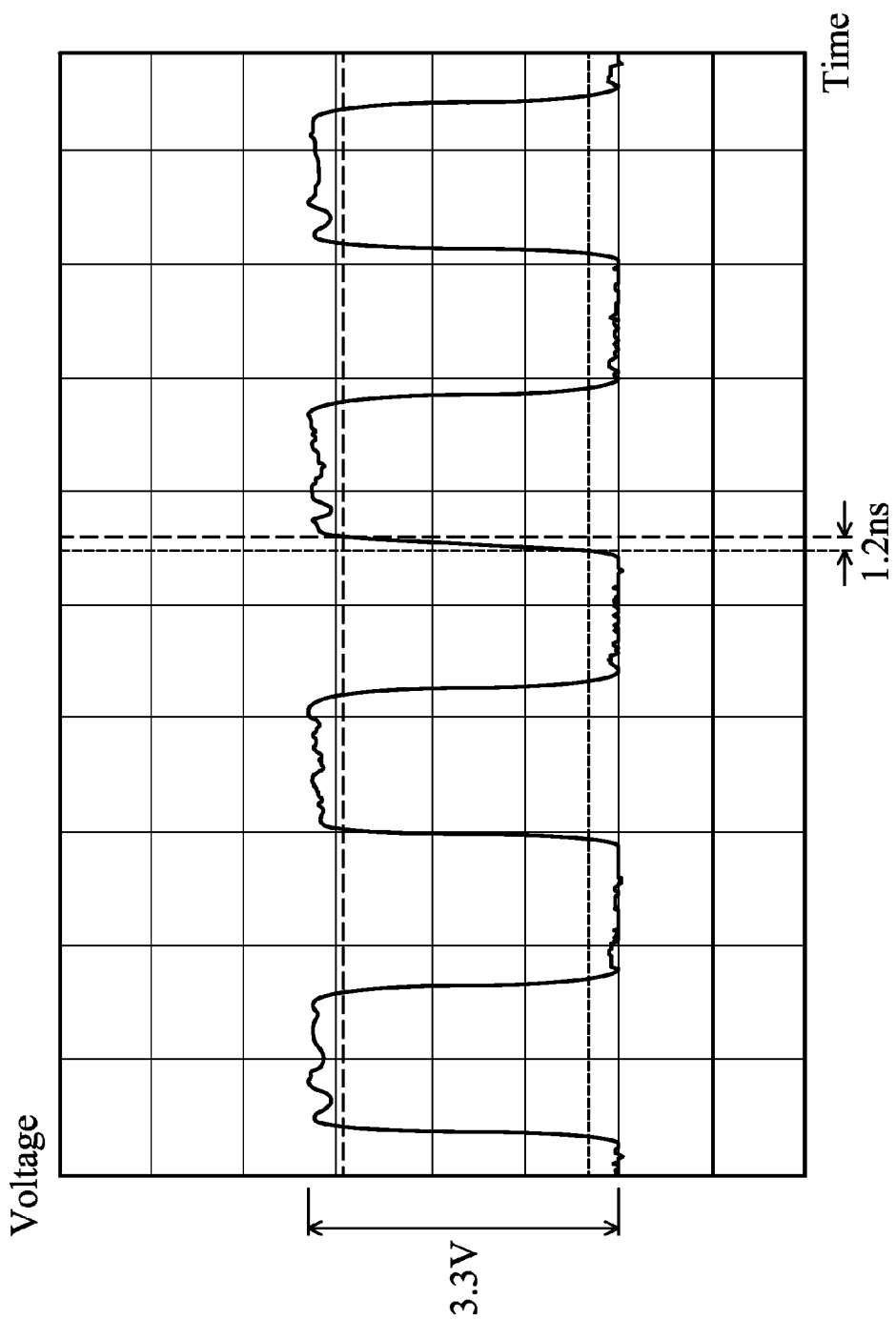
FIG. 2A is a conventional schematic diagram of a data signal output by a flash memory driven by a driving current with an appropriate level.
Figure 2B:
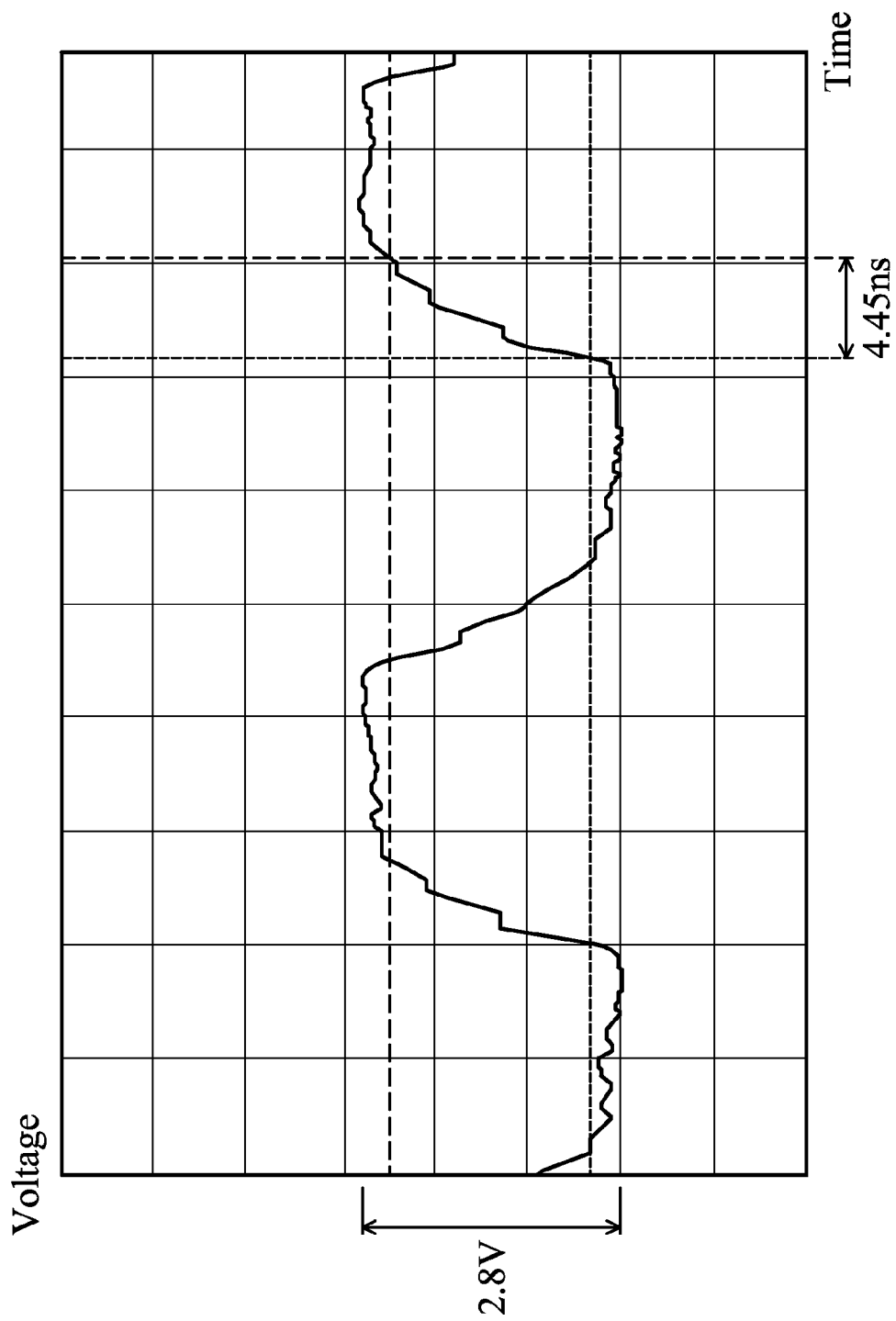
FIG. 2B is a conventional schematic diagram of a data signal output by a flash memory driven by a driving current with an insufficient level.
Figure 3:
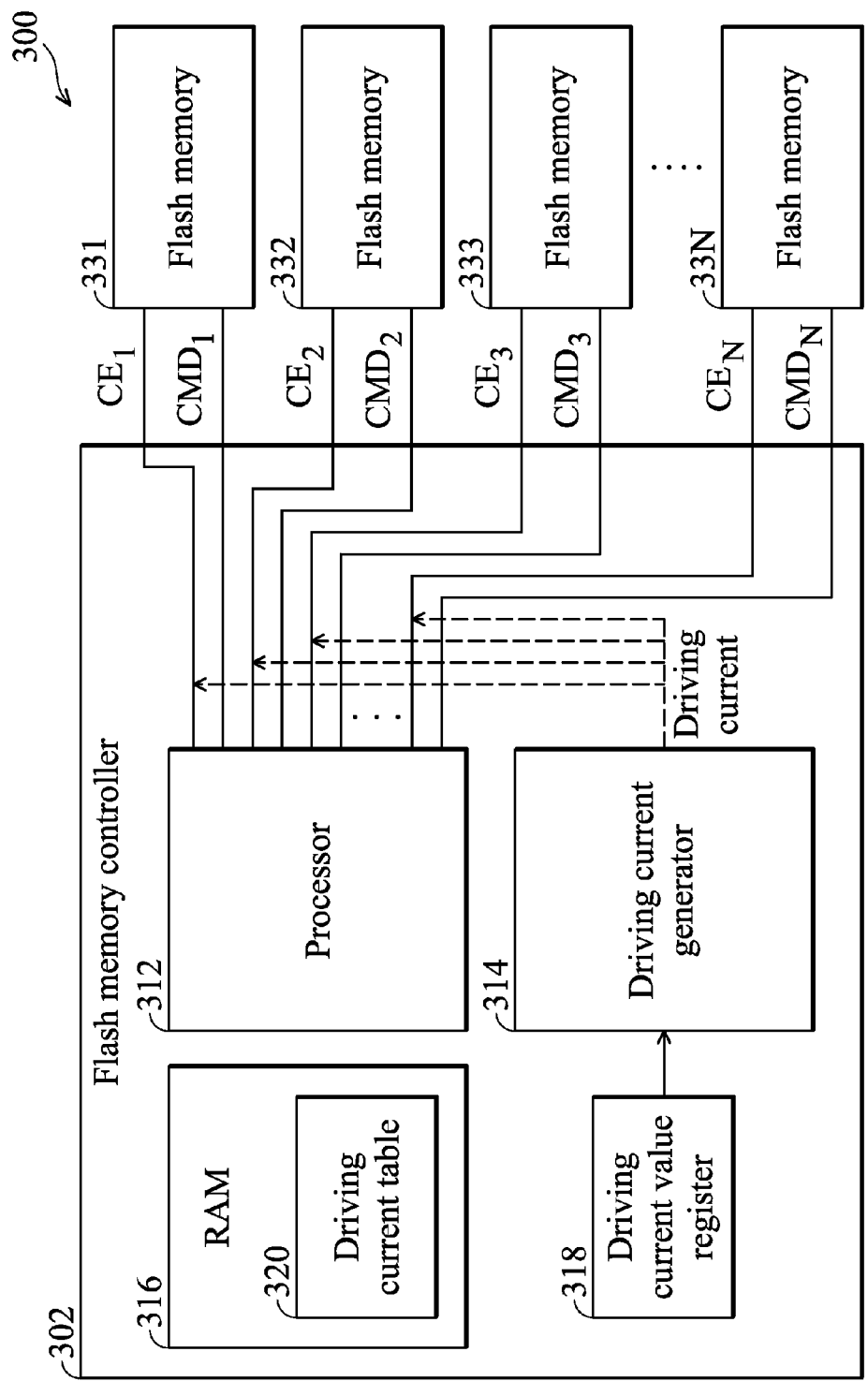
FIG. 3 is a block diagram of an electronic apparatus according to the invention.

Referring to FIG. 3, a block diagram of an electronic apparatus 300 according to the invention is shown. In one embodiment, the electronic apparatus 300 comprises a flash memory controller 302 and N flash memories 331~33N. The flash memory controller 302 comprises a plurality of chip enable pins $CE_1, CE_2, CF_3, \ldots, CE_N$ respectively coupled to the flash memories 331, 332, 333, . . . , 33N. In one embodiment, the flash memory controller 302 comprises a processor 312 and a driving current generator 314. A plurality of command lines $CMD_1$, $CMD_2$, $CMD_3$, ..., $CMD_N$ are respectively coupled between the processor 312 and the flash memories 331, 332, 333, ..., 33N. The processor 312 transmits data access commands to the flash memories 331~33N via the command lines $CMD_1$~$CMD_N$. When the flash memories 331~33N receive data access commands, the flash memories 331~33N send response information back to the processor 312 via the command lines $CMD_1$~$CMD_N$.

The driving current generator 314 generates a driving current. The driving current drives the flash memories 331, 332, 333, ..., 33N via the chip enable pins $CE_1$, $CE_2$, $CE_3$, ..., $CE_N$. In one embodiment, the flash memory controller 302 comprises a driving current value register 318. The driving current value register 318 stores a driving current value. When the driving current value register 318 stores a driving current value, the driving current generator 314 generates a driving current with a level greater than or equal to the driving current value. The processor 312 therefore can amend the driving current value stored in the driving current value register to change the level of the driving current generated by the driving current generator 314.

The processor 312 calculates a total number N of flash memories 331~33N coupled to the flash memory controller 302, and sets the driving current value stored in the driving current value register 318 according to the total number N of flash memories 331~33N. The driving current generator 314 therefore generates a driving current with an appropriate level corresponding to the total number of flash memories 331~33N. In one embodiment, the driving current value increases with an increase of the total number N of flash memories 331~33N. Each of the flash memories 331~33N therefore is allotted a portion of the driving current with a level which is enough to drive the operations thereof. In one embodiment, the processor 312 determines the driving current value corresponding to the total number N of the flash memories 331~33N according to an algorithm, wherein the algorithm indicates a mapping relationship between the total number N of the flash memories and the level of driving current.

In another embodiment, the flash memory controller 302 comprises a random access memory (RAM) 316. The RAM 316 stores a driving current table 320, and a plurality of total numbers of flash memories and corresponding predetermined driving current values are stored in the driving current table 320. When the processor 312 calculates the total number N of flash memories 331~33N, the processor 312 searches the driving current table 320 for the predetermined driving current value corresponding to the total number N of flash memories 331~33N as the driving current value.

Referring to FIG. 5, a schematic diagram of an embodiment of a driving current table 320 according to the invention is shown. For example, when the total number of flash memories controlled by the flash memory controller 302 is 1, the predetermined driving current value is 4 mA. When the total number of flash memories controlled by the flash memory controller 302 is 4, the predetermined driving current value is 8 mA. When the total number of flash memories controlled by the flash memory controller 302 is 64, the predetermined driving current value is 64 mA. Thus, when the total number of flash memories is increased, the predetermined driving current value is also increased to generate a driving current with a level corresponding to the total number of flash memories.

Figure 4:
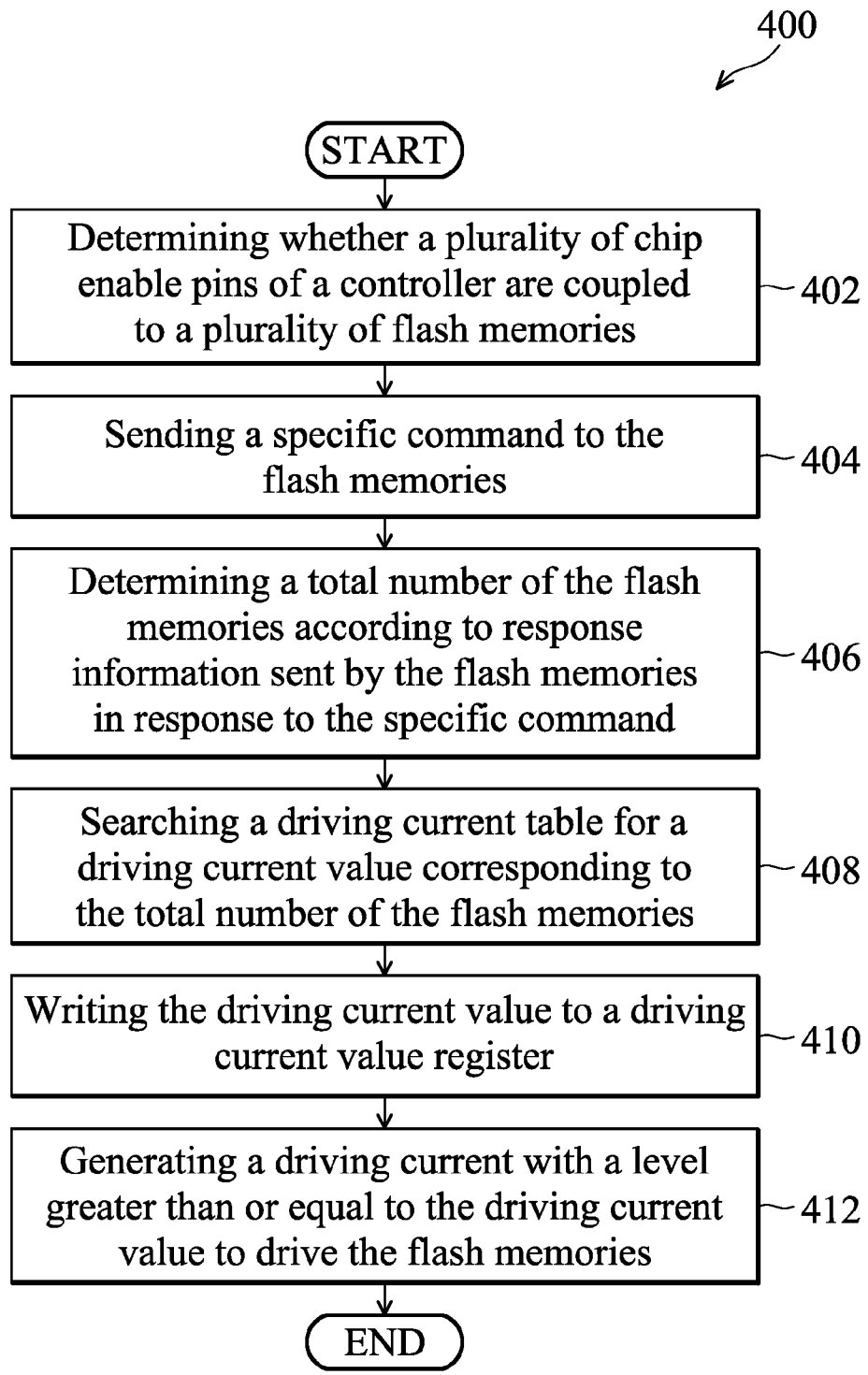
FIG. 4 is a flowchart of a method for determining a level of driving current according to the total number of flash memories according to the invention.

Referring to FIG. 4, a flowchart of a method 400 for determining the level of driving current according to a total number of flash memories according to the invention is shown. First, power to the electronic apparatus 300 is switched on. The flash memory controller 302 then determines whether a plurality of chip enable pins $CE_1$~$CE_N$ of the flash memory controller 302 are coupled to a plurality of flash memories 331~33N (step 402). In one embodiment, the processor 312 determines whether the chip enable pins $CE_1$~$CE_N$ are coupled to the flash memories 331~33N according to the voltages on the chip enable pins $CE_1$~$CE_N$, and then determines the total number of flash memories 331~33N according to the voltages on the chip enable pins $CE_1$~$CE_N$.

The processor 312 then sends a specific command to the flash memories 331~33N (step 404). After the flash memories 331~33N receive the specific command, each of the flash memories 331~33N sends response information back to the processor 312, and the processor 312 determines the total number N of flash memories 331~33N according to the response information sent from the flash memories 331~33N (step 406). In one embodiment, the specific command is a read flash identifier command which requests the flash memories 331~33N to read the identifiers thereof. The processor 312 can then determine the total number of flash memories 331~33N according to the total number of flash identifiers received by the flash memory controller 302. In another embodiment, the specific command is a read command or a write command. When the flash memories 331~33N send read response information or write response information to the flash memory controller 302, the processor 312 determines the total number of flash memories 331~33N according to the read response information or write response information received by the flash memory controller 302.

After the processor 312 determines the total number of flash memories 331~33N, the processor 312 searches the driving current table 320 for a predetermined driving current value corresponding to the total number of flash memories 331~33N as the driving current value (step 408). The processor 312 then writes the driving current value to the driving current value register 318 (step 410). The driving current generator 314 then generates a driving current with a level greater than or equal to the driving current value stored in the driving current value register 318 to drive the flash memories 331~33N (step 412). Because the level of the driving current is determined according to the total number N of flash memories 331~33N, the driving current has enough power to drive all of the flash memories 331~33N controlled by the flash memory controller 302. Signal attenuation and noise increase due to a driving current with an insufficient level is therefore avoided, and data-access errors are therefore also avoided.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flash memory controller, coupled to a plurality of flash memories, comprising:
a driving current generator, generating a driving current to drive the flash memories; and
a processor, calculating a total number of the flash memories, determining a driving current value according to the total number of the flash memories, and directing the driving current generator to generate the driving current with a level greater than or equal to the driving current value;

wherein the driving current value is determined by the processor to be increased with an increase of the total number of flash memories, wherein the flash memory controller is coupled to the flash memories via a plurality of chip enable pins, and the processor determines the total number of the flash memories according to the voltages of the chip enable pins.

2. The flash memory controller as claimed in claim 1, wherein the flash memory controller sends a specific command to the flash memories, receives response information corresponding to the specific command from the flash memories, and determines the total number of the flash memories according to the response information.

3. The flash memory controller as claimed in claim 2, wherein the specific command requests the flash memories to read identifiers of the flash memories, and the response information comprises the identifiers sent from the flash memories to the flash memory controller.

4. The flash memory controller as claimed in claim 2, wherein the specific command requests the flash memories to access data from the flash memories, and the response information comprises the execution status of data-access operations performed by the flash memories.

5. The flash memory controller as claimed in claim 1, wherein the flash memory controller further comprises a driving current value register, the processor writes the driving current value to the driving current value register, and the driving current generator generates the driving current according to the driving current value stored in the driving current value register.

6. The flash memory controller as claimed in claim 1, wherein the processor determines the driving current value according to an algorithm, and the algorithm indicates a mapping relationship between the driving current value and the total number of the flash memories.

7. The flash memory controller as claimed in claim 1, wherein the flash memory controller comprises a random access memory, a driving current table is stored in the random access memory, a plurality of predetermined driving current values and a plurality of corresponding total numbers of the flash memories are recorded in the driving current table, and the processor searches the driving current table for the predetermined driving current value corresponding to the total number of the flash memories as the driving current value.

8. A method for generating a driving current for flash memories, comprising:
calculating the total number of a plurality of flash memories coupled to a flash memory controller;
determining a driving current value according to the total number of the flash memories; and
directing a driving current generator to generate a driving current with a level greater than or equal to the driving current value to drive the flash memories;
wherein the driving current value is determined to be increased with an increase of the total number of the flash memories, wherein the flash memory controller is coupled to the flash memories via a plurality of chip enable pins, and determination of the driving current value comprises determining the total number of the flash memories according to the voltages of the chip enable pins.

9. The method as claimed in claim 8, wherein determination of the driving current value comprises:
sending a specific command by the flash memory controller to the flash memories;
receiving response information corresponding to the specific command by the flash memory controller from the flash memories; and
determining the total number of the flash memories according to the response information.

10. The method as claimed in claim 9, wherein the specific command requests the flash memories to read the identifiers of the flash memories, and the response information comprises the identifiers sent from the flash memories to the flash memory controller.

11. The method as claimed in claim 9, wherein the specific command requests the flash memories to access data from the flash memories, and the response information comprises the execution status of data-access operations performed by the flash memories.

12. The method as claimed in claim 8, wherein direction of the driving current generator comprises:
writing the driving current value to a driving current value register of the flash memory controller; and
directing the driving current generator to generate the driving current according to the driving current value stored in the driving current value register.

13. The method as claimed in claim 8, wherein determination of the driving current value comprises determining the driving current value according to an algorithm, wherein the algorithm indicates a mapping relationship between the driving current value and the total number of the flash memories.

14. The method as claimed in claim 8, wherein determination of the driving current value comprises:
storing a driving current table in a random access memory of the flash memory controller, wherein a plurality of predetermined driving current values and a plurality of corresponding total numbers of the flash memories are recorded in the driving current table; and
searching the driving current table for the predetermined driving current value corresponding to the total number of the flash memories as the driving current value.

* * * * *